(12) United States Patent
Maheshwari et al.

(10) Patent No.: US 6,395,097 B1
(45) Date of Patent: May 28, 2002

(54) METHOD AND APPARATUS FOR CLEANING AND REMOVING FLUX FROM AN ELECTRONIC COMPONENT PACKAGE

(75) Inventors: Abhay Maheshwari, San Jose; Shirish Shah, Fremont, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/465,132

(22) Filed: Dec. 16, 1999

(51) Int. Cl.$^7$ .............................................. C03C 23/00
(52) U.S. Cl. ........................ 134/2; 134/22.1; 134/22.19; 134/26; 134/34; 134/36; 134/42; 134/182; 134/186; 134/902; 438/106; 438/115; 438/108; 438/906; 257/678; 257/687
(58) Field of Search ........................ 134/2, 22.1, 22.19, 134/26, 34, 36, 42, 182, 186, 902; 438/115, 106, 108, 906; 257/678, 687

(56) References Cited

U.S. PATENT DOCUMENTS

| | | | | |
|---|---|---|---|---|
| 3,915,739 A | * | 10/1975 | Maahs et al. ................... | 134/21 |
| 4,155,775 A | * | 5/1979 | Alpaugh et al. ................ | 134/3 |
| 4,475,259 A | * | 10/1984 | Ishii et al. ..................... | 15/102 |
| 5,002,616 A | * | 3/1991 | Ketelhohn ................... | 134/25.1 |
| 5,376,588 A | | 12/1994 | Pendse | |
| 5,385,869 A | * | 1/1995 | Liu et al. ..................... | 437/209 |
| 5,696,027 A | | 12/1997 | Crane, Jr. | |
| 5,710,071 A | | 1/1998 | Beddingfield et al. ....... | 438/108 |
| 5,952,726 A | | 9/1999 | Liang | |
| 6,015,722 A | * | 1/2000 | Banks et al. ................. | 438/108 |
| 6,048,753 A | | 4/2000 | Farnworth | |
| 6,064,113 A | | 5/2000 | Kirkman | |
| 6,074,897 A | * | 6/2000 | Degani et al. ............... | 438/115 |
| 6,111,756 A | | 8/2000 | Moresco | |
| 6,169,036 B1 | * | 1/2001 | Bhowmilk et al. ........ | 438/710 |
| 6,177,347 B1 | * | 1/2001 | Liu et al. ..................... | 438/675 |
| 6,198,635 B1 | | 3/2001 | Shenoy et al. | |
| 6,232,238 B1 | * | 5/2001 | Chang et al. ............... | 438/725 |
| 6,240,934 B1 | * | 6/2001 | Durst et al. ................ | 134/2 |
| 6,265,309 B1 | * | 7/2001 | Gotoh et al. ............... | 438/637 |

FOREIGN PATENT DOCUMENTS

JP      03-094428      * 4/1991

* cited by examiner

Primary Examiner—Sharidan Carrillo
(74) Attorney, Agent, or Firm—Fitch, Even, Tabin & Flannery

(57) ABSTRACT

The present invention is a method for cleaning the cavities in electronic components by providing a semiconductor component having an outside surface and a cavity therein. The component including hole in the outside surface enabling fluid flow in to or out of the cavity. The component is immersed in a solvent bath where solvent is flowed into the cavity using the hole, the solvent cleaning the cavity and then optionally being evacuated from the cavity. Specifically, the principles of the present invention may be used to clean the underfill space of a flip-chip package. The flip-chip package includes a packaging substrate with an evacuation port passing through the bulk of the packaging substrate such that the port is in communication with the underfill space and a bottom surface with the packaging substrate. This assembly is immersed in a solvent filled solvent bath. Solvent is drawn into the underfill space through said port. Alternatively, solvent may be injected into the underfill space through the port. Moreover, both approaches may be combined to modulate the solvent flow through the underfill space. The act of drawing or injecting solvent into the underfill space cleans the flux and residues from the underfill space of the die/substrate assembly. After cleaning, the underfill space can be rinsed. After which the assembly is subject to further processing. The present invention includes an apparatus for cleaning electronic components in accordance with the present invention. The system includes a solvent containing solvent bath, a solvent flow means for flowing solvent under pressure into or out of an underfill space of an electronic component, and a rack for holding a plurality of components in position such that the solvent flow means can effectively flow solvent into the underfill spaces of the components.

5 Claims, 4 Drawing Sheets

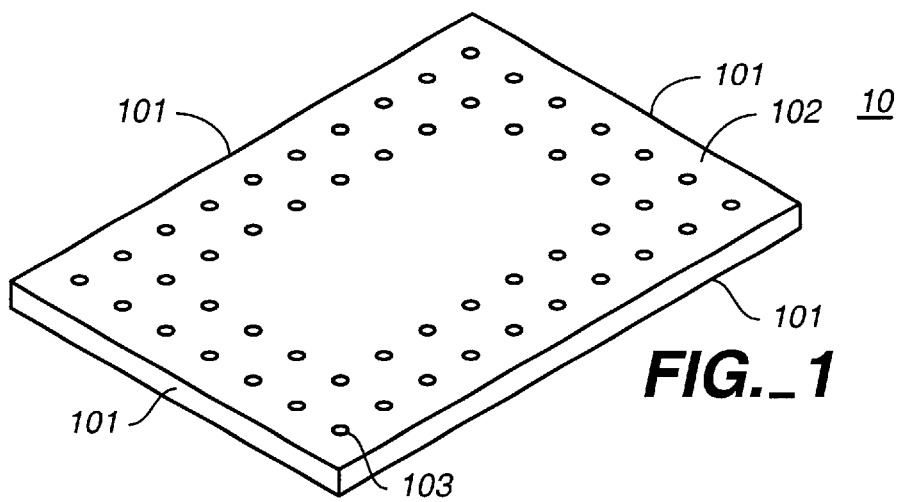
FIG._1
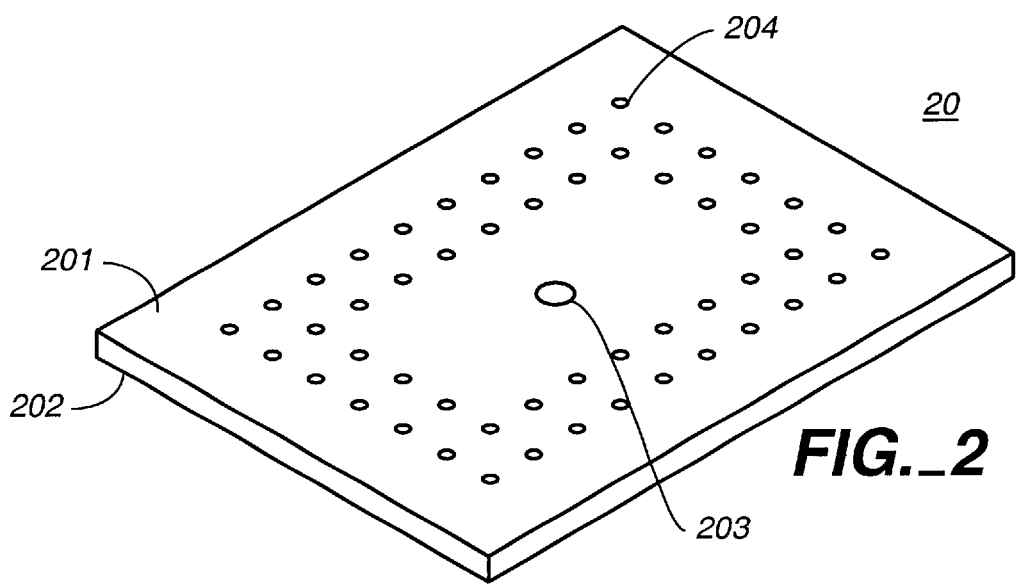
FIG._2
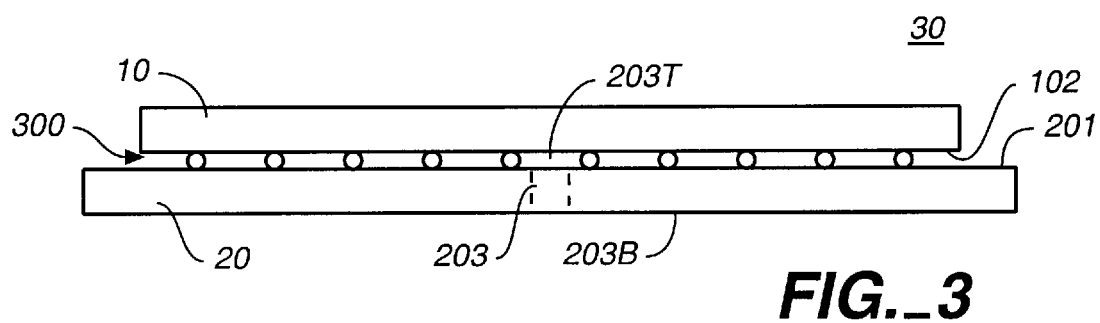
FIG._3

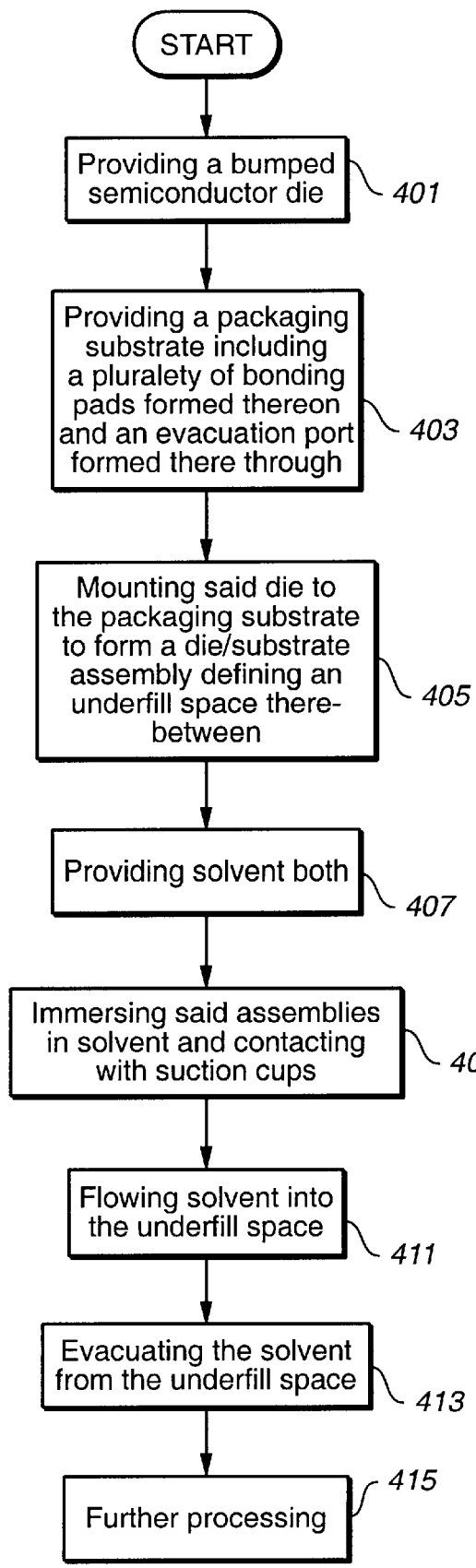
FIG._4

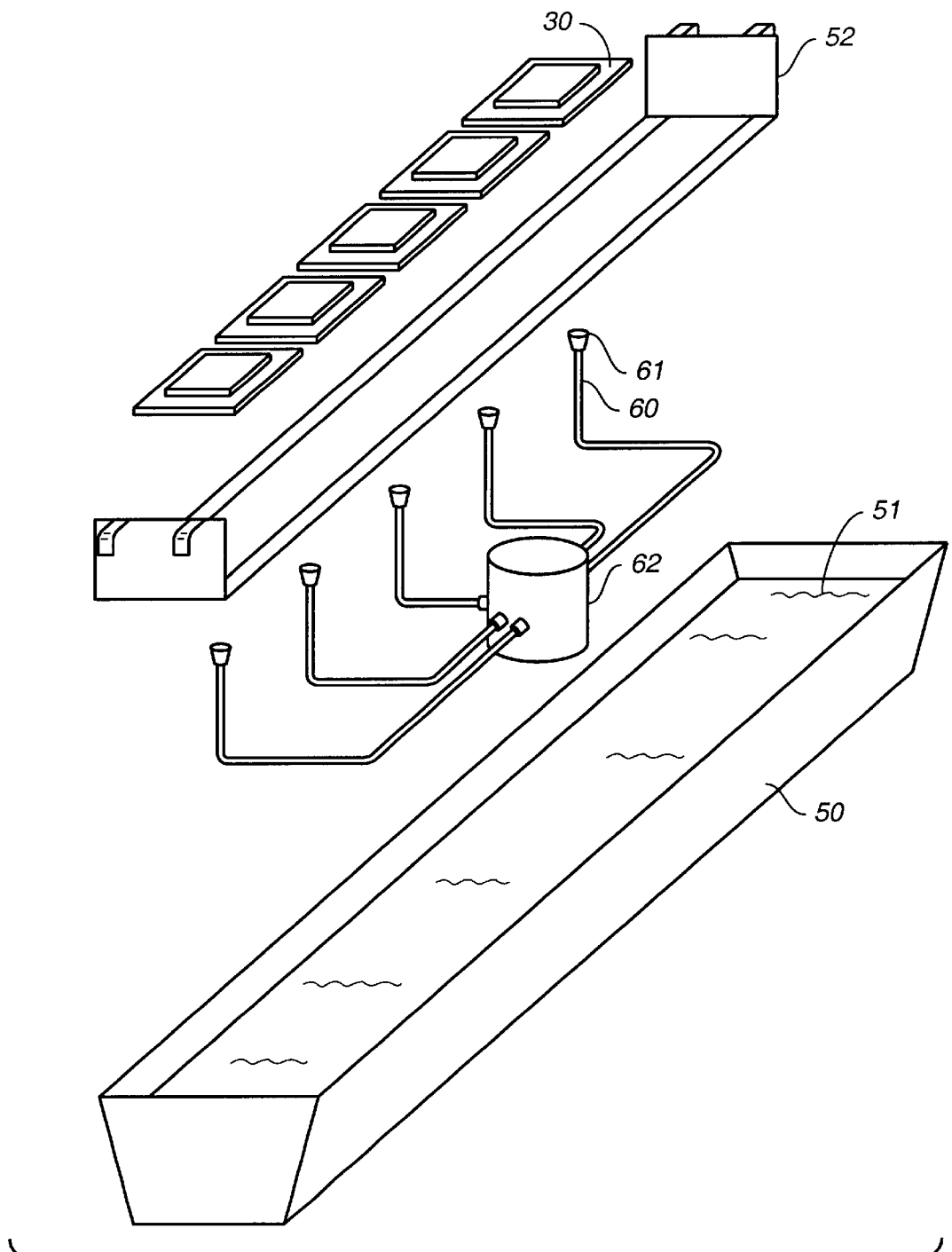
FIG._5

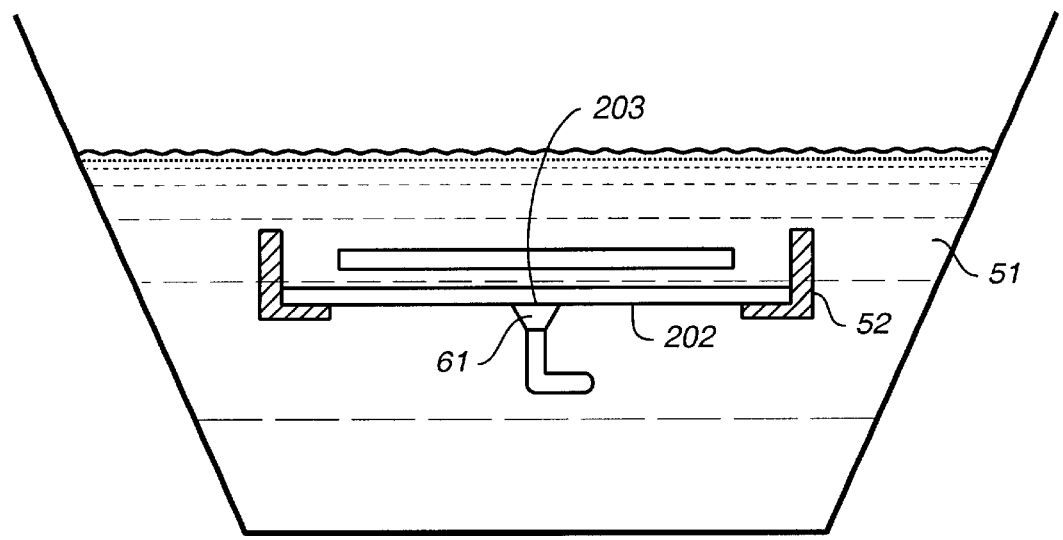
FIG._6
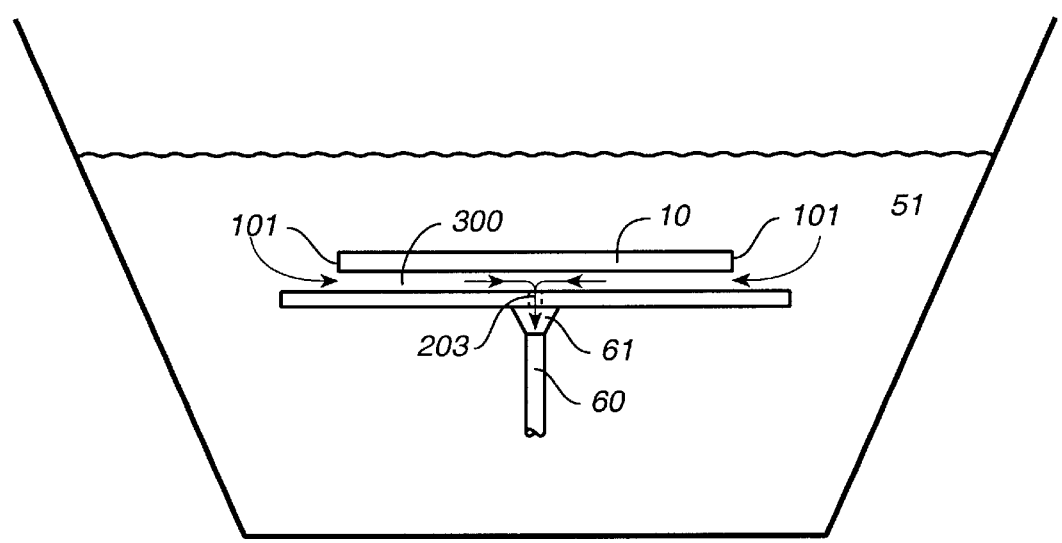
FIG._7

METHOD AND APPARATUS FOR CLEANING AND REMOVING FLUX FROM AN ELECTRONIC COMPONENT PACKAGE

TECHNICAL FIELD

The present invention relates to methodologies and devices used for cleaning electronic semiconductor packages or assemblies incorporating flip-chip semiconductor devices. In particular, the invention contemplates methodologies for cleaning the underfill space between a semiconductor die and a packaging substrate in a flip-chip assembly.

BACKGROUND OF THE INVENTION

A flip-chip semiconductor device is one in which a semiconductor chip (die) is directly mounted onto a packaging substrate. Conductive terminals on an electrically active surface of the semiconductor die, usually in the form of conductive solder bumps, are directly contacted to the wiring patterns on the packaging substrate without the use of wire bonds, tape-automated bonding (TAB), or other like methods. Because the conductive bumps making the connections to the packaging substrate are on the active surface of the die or chip, the die is mounted in a face-down manner, thus the name flip-chip. Flip-chip semiconductor devices permit higher component density and faster access times than conventionally packaged semiconductor devices. These advantages have led to increased usage of such flip-chip devices in the electronic industry.

One problem in flip-chip mounting is that under normal operating conditions, the conductive bumps which couple the die to the packaging substrate are subjected to significant stress. This stress leads to thermal fatigue in the bumps and at the interfaces where the bumps contact the conductive bonding pads of a packaging substrate. This stress frequently leads to connection failures. Presently, the region between the die and the packaging substrate (referred to herein as the underfill space) is filled with an encapsulation or underfill material (typically, such materials are epoxies) to form an underfill layer. This reduces the stresses on the bumps making for more reliable semiconductor packages.

In order to effectively fill the underfill space between the die and the packaging substrate with encapsulation materials, it is important that the underfill space be well cleaned. Left over flux from the reflow processes that bond the conductive bumps of the die to the bonding pads of the substrate must be removed, as must other residues. Moreover, the cleaning solvents used in flux removal processes must also be removed. Residue or remaining flux leads to delamination problems in the underfill layer after the underfill space is filled. Thus, cleaning occupies a critical role in semiconductor device manufacture.

Conventional cleaning processes remove flux by immersing an assembled die and packaging substrate (referred to hereinafter as the die/substrate assembly) in a bath of appropriate solvent, for example, turpentine based solutions such as EC-7R from Petroform. Typically, the assembly is then agitated in the solvent bath. The solvent propagates into the underfill space by capillary action. This cleans away flux and other debris. While such processes are suitable for their intended purposes, advances in connection technology have made apparent some of the limitations of current cleaning methodologies. Moreover, as the size of semiconductor dies increase and the space between the die and the packaging substrate decreases, capillary action and agitation, as a means of propagating solvent throughout the underfill space during cleaning, becomes inadequate making the cleaning process more difficult.

As techniques for interconnecting the die to the packaging substrate improve, the space between the die and packaging substrate is reduced. Distances as small as 25 microns between the die and packaging substrate can comfortably be achieved with still smaller dimensions being attainable in the near future. Additionally, semiconductor die size is increasing, with die sizes of 25 mm×25 mm and larger coming into common usage. While advantageous from a product standpoint, such reduced underfill gaps between die and substrate and increased die sizes create certain manufacturing difficulties. One difficulty of particular importance deals with the problem of effectively cleaning the underfill space.

During conventional cleaning the solvent propagates into the underfill space by capillary action. Because the assembly is immersed in solvent, the solvent propagates into the underfill space from all sides of the die. This results in air being trapped near the center of the underfill space. The presence of air prevents the solvent from effectively propagating further into the underfill space. Furthermore, when solvent does propagate into the underfill space it is commonly not affected by the agitation of the cleaning process, meaning no fresh solvent recirculates into the underfill space. This has the unfortunate consequence of inadequately cleaning flux or other residues from the center regions of the underfill space. Also, once solvent is introduced into the underfill space it is not easily removed, consequently the contaminants suspended in the solvent remain in the underfill space.

What is needed is an improved process for removing flux and other residues from the underfill space between the semiconductor die and packaging substrate. Also needed are a system and apparatus for accomplishing the process. Finally, an improved packaging substrate is needed to facilitate these process improvements.

SUMMARY OF THE INVENTION

Accordingly, the principles of the present invention contemplate an electronic component structure having a conventional semiconductor die, with an active circuit surface having a plurality of conductive bumps formed thereon, mounted active surface down onto a top surface of a packaging substrate such that said conductive bumps are directly connected to a plurality of bonding pads formed on the top surface of said substrate to form a die/substrate assembly. An area between the packaging substrate and the die defining an underfill space. The packaging substrate includes an evacuation port which passes through the bulk of the packaging substrate. The port having openings in the top surface and a bottom surface of the packaging substrate, the top opening of the port being in communication with the underfill space. This assembly may be cleaned using the principles of the present invention.

In accordance with the principles of the present method for cleaning of flux and other residues from the die/substrate assemblies a die/substrate assembly is provided. A solvent filled solvent bath is provided. The die/substrate assembly is immersing in the solvent of the solvent bath. Solvent is drawn into the underfill space of the die/underfill substrate through said port. Alternatively, solvent may be injected into the underfill space through the port. Moreover, both approaches may be combined to modulate the solvent flow through the underfill space. The act of drawing and/or injecting solvent into the underfill space cleans the flux and residues from the underfill space of the die/substrate assembly. After cleaning, the underfill space can be rinsed. The die/substrate assembly is subject to further processing.

Also in accordance with the principles of the present invention an apparatus for cleaning electronic components is provided. The system comprises a solvent-containing solvent bath, a solvent flow means for flowing solvent under pressure into or out of an underfill space of a die/substrate assembly, and a rack for holding a plurality of die/substrate assemblies in position such that said solvent flow means can effectively flow solvent into the underfill spaces of the assemblies.

Other features of the present invention are disclosed or made apparent in the section entitled "DETAILED DESCRIPTION OF THE PREFERRED EMBODIMENT".

BRIEF DESCRIPTION OF THE DRAWINGS

For a fuller understanding of the present invention, reference is made to the accompanying drawings in the following Detailed Description of the Invention. Reference numbers and letters refer to the same or equivalent parts of the invention throughout the several figures of the drawings. In the drawings:

FIG. 1 is a perspective view of a typical semiconductor die with solder balls in place on an active circuit surface.

FIG. 2 is a perspective view of a packaging substrate of one embodiment of the present invention, the substrate including a evacuation port therein.

FIG. 3 is a section view of a semiconductor die and a packaging substrate of the embodiment of FIG. 2, illustrating an evacuation port and underfill space.

FIG. 4 is a flowchart showing a method of cleaning semiconductor components in accordance with the principles of another embodiment of the present invention.

FIG. 5 is an exploded perspective view of a system for cleaning semiconductor components in accordance with the principles of a further embodiment of the present invention.

FIG. 6 is a cross section view of a die/substrate assembly immersed in a solvent bath of the system of FIG. 5.

FIG. 7 is a cross section view of a die/substrate assembly immersed in the solvent bath of FIG. 6 illustrating solvent flow.

DETAILED DESCRIPTION OF THE PREFERRED EMBODIMENT

Generally, the present invention contemplates an improved method of cleaning electronic component assemblies, in particular, a method for cleaning flux and other unwanted residues from electronic component assemblies is disclosed. Additionally, the present invention contemplates an apparatus enabling the practice of the invention.

Generally, the present invention comprises a methodology for cleaning a cavity in an electronic component. A typical method of the present invention begins by providing a semiconductor component having an outside surface and a cavity therein. A hole is formed in the outside surface, the hole enabling fluid flow in to or out of the cavity. A solvent bath is provided and the component is immersed in the solvent of the solvent bath. The solvent is flowed into the cavity using the hole, the solvent cleaning the cavity and then optionally being evacuated from the cavity. A specific embodiment of the present invention is discussed below.

In accordance with the embodiment of the present invention illustrated in FIG. 7, a process for cleaning a cavity in an electronic component includes the steps of providing an electronic component comprising a die mounted on a packaging substrate such that a cavity is defined between the die and the packaging substrate; forming a port in the packaging substrate for flowing a fluid through the cavity; providing a solvent bath containing a solvent; coupling a solvent line to the port and to the solvent bath such that the solvent may flow from the port into or out of the solvent line; immersing the electronic component in the solvent bath for flowing the solvent through the cavity under pressure; and flowing the solvent through the cavity under pressure in a flow direction through the solvent line to clean the cavity.

FIG. 1 depicts a conventional semiconductor die 10 having a perimeter about its edges 101 and having conductive bumps 101 on an active circuit surface 102 thereof. FIG. 2 depicts a packaging substrate 20 which is provided having a top surface 201 and a bottom surface 202 and a hole or evacuation port 203 passing therethrough. The port 203 including openings in the top and bottom surfaces of the substrate 20. The top surface 201 of the substrate 20 also includes bonding pads 204. The die 10 is mounted onto the substrate 20 such that the conductive bumps 101 of the die 10 are directly connected to the bonding pads 204 of the substrate 20 to form a flip-chip die/substrate assembly 30 (as illustrated in FIG. 3). The die/substrate assembly 30 is constructed such that a cavity or underfill space 300 is sandwiched between the top surface 201 of the packaging substrate and the active circuit surface 102 of the die 10. The edges of the underfill space 300 are further defined by the perimeter of the die. The evacuation port 203 includes an opening 203T in the top surface of the packaging substrate 20. The opening 203T is in communication with the underfill space 300. The die/substrate assembly 30 is immersed in solvent. The solvent is then either flowed into the underfill space 300 through the evacuation port 203 cleaning the underfill space 300 or suctioned through port 203B, where the entire assembly is immersed in solvent solution and solvent flows from the edge openings into the underfill space 300.

Illustrated in FIG. 4 is a process flow chart illustrating a representative processes for cleaning a die/substrate assembly in accordance with another embodiment. Such a process begins by providing a conventional semiconductor die (Step 401). The functionality of the die is unimportant to the present embodiment which is applicable in a bond range of semiconductor die types. For example, the semiconductor die may be a memory, a microprocessor, an analog device, an application specific integrated circuit device, a similar device or virtually any type of semiconductor. Additionally, the particular shape of the semiconductor die is not important for the purpose of practicing the present embodiment. The semiconductor die includes an active circuit surface which includes a plurality of conductive bumps formed thereon. The manner in which the conductive bumps are formed, and the materials from which they are formed, are also not restricted by the present embodiment. In a preferred form of the present embodiment invention, the conductive bumps are formed as solder bumps. Conventional methods of forming the bumps maybe used to form the conductive bumps. One method is to selectively deposit a metal on the active surface of the die (for instance using deposition through a shadow mask), followed by a reflow process which establishes the final bump composition and a generally spherical shape. In the industry, this method is sometimes referred to as C4 (controlled collapsed chip connection) bump processing.

A packaging substrate is provided (Step 403). In many respects the packaging substrate of the present embodiment is constructed as a conventional packaging substrate. Reference to FIG. 2 shows an example of a packaging substrate 20 suitable for use in accordance with the present embodiment. Typical substrates 20 include many insulating layers and a plurality of conductive layers which are laminated or co-fired between the various insulating layers. In two typical examples, packaging substrates may be in the form of an organic substrate or a ceramic substrate. In organic substrates, the bulk material of the insulating layers is typically a resin, such as bismaleimide thiazine (BT) resin. In the case of organic substrates, the conductive layers are typically formed of a copper material which has been laminated on the insulating layers, and subsequently patterned and etched to form a desired conductive pattern. Multiple dielectric layers having conductive layers laminated thereon are then pressed together to form a composite, multi-layer packaging substrate. In the case of ceramic substrates, the insulating layers are typically formed of some type of ceramic material such as alumina, or glass ceramic. The conductive layers ceramic packaging substrates are commonly formed of copper, tungsten, molybdenum or other suitable materials, formed, for example, by screen printing metal paste in a desired pattern. As with organic substrates, the insulating layers are laminated together to form a multi-layer ceramic substrate. By subsequently firing the substrate at about 800° C.–1600° C. the ceramic is densified and the metal pastes are made more conductive. Referring to FIG. 2, such substrates 20 are formed having a top surface 201 and a bottom surface 202. Differing from ordinary packaging substrates, substrate 20 of the present embodiment utilizes an additional feature to facilitate the cleaning process of the present embodiment. Specifically, as illustrated in FIGS. 2 and 3, the packaging substrate 20 includes an evacuation port 203 which extends from the top surface 201 of the substrate through to the bottom surface 202 of the substrate. One purpose of providing the port 203 in the substrate 20 is to facilitate the flow of a solvent through the port 203 during a cleaning process which is explained below.

The die 10 is flipped over and mounted onto the packaging substrate 20 to form a die/substrate assembly 30, such that the bumps 103 of said active surface 102 are electrically connected to the bonding pads 204 of the top surface 201 of the packaging substrate 20. The die 10 and packaging substrate 20 define an underfill space 300 sandwiched between the die 10 and substrate 20. The evacuation port 203 includes an opening 203T in the top surface 201 of the substrate 20 such that said opening 203T in the top surface 201 is in communication with said underfill space 300. To effectively serve its function, the port 203 has a diameter in the range of about 5 mils (thousandths of an inch) to about 30 mils, preferably about 10–15 mils. The port 203 may be formed by drilling or punching. Furthermore, thinner substrates allow for smaller ports. The maximum port diameter is limited by the fact that larger holes in a substrate surface limit the area available for circuit routing.

With continued reference to FIG. 4, a solvent bath is provided (Step 407). An exploded view of one embodiment of a solvent bath is shown in FIG. 5. A solvent container 50 is filled with enough solvent 51 to immerse the die/substrate assemblies 30. Commonly, organic solvents may be used to remove flux and other unwanted residues. A typical example of satisfactory organic solvents are xylene or turpentine which may be obtained from many semiconductor chemical suppliers (for example Petroform). These solvents are typically used at temperatures ranging from about 25 to 80° C. and for cleaning times in the range 15 to 45 minutes. It is additionally contemplated by the inventors that the methods and apparatus' of the present invention may be used with a wide range of other solvents to remove flux and other unwanted residues.

Referring to FIGS. 5 and 6, the solvent container 50 includes a rack 52 for supporting at least one die/substrate assembly 30 as the assemblies 30 are placed on the rack 52 and immersed in solvent 51. The rack 52 is sized hold at least one of said die/substrate assemblies 30 while they are cleaned in the solvent bath.

Referring to both FIGS. 5 and 6, the apparatus also includes one or more suction cups 61 each attached to a first end of one or more solvent lines 60. A typical suction cup 61 is about 0.25 inches in diameter. The cups are constructed of material which is not degraded by the solvents used, for example teflon, which are produced by E.I. Dupont de Nemours & Company of Wilmington, Del. A typical solvent line 60 is also constructed of material which is not degraded by the solvents used, an example being a 1 mm teflon line as manufactured also by E.I. Dupont. Each solvent line 60 includes a second end which is attached to a pump 62, for example, a pump 62. Typically the pumps 62 include a recirculation filter (not shown) to prevent contaminants from polluting the solvent bath. Any commercially available chemical pump and filter are satisfactory. The solvent lines 60 may all be connected to the same pump or to a plurality of pumps (or other means for flowing solvent into the underfill space 300).

With continued reference to FIG. 4, the assemblies 30 are immersed in solvent (Step 409). With reference to FIG. 6, the suction cups 61 are urged into sealable contact with the bottom surface 202 of the substrate 20 such that solvent 51 can flow through the evacuation port 203 into or out of the solvent lines 60.

Once sealed, solvent 51 can then be flowed into the underfill space 300 (Step 411). As shown in FIG. 7, the solvent 51 is flowed under pressure into the underfill space 300. This process is referred to herein as "drawing" the solvent 51 from the bath into the underfill space 300. The arrows show the direction of solvent flow. The solvent 51 is drawn into the underfill space 300 from the bath by the pump (not shown), through the port 203, through the suction cup 61, into the solvent line 60, and into the pump (not shown) where it may be filtered and recirculated back into the solvent bath. Solvent 51 can enter the underfill space 300 around each of the edges 101 of the die 10 along its entire perimeter advantageously cleaning the entire underfill space 300. Solvent 51 may be drawn into the underfill space at a variety of flow rates with a range of 20 ml/min being satisfactory, with a preferred flow rate of about 50 ml/min. A satisfactory cleaning cycle is in the range of about 5–30 minutes, with a preferred cycle lasting about 5–10 minutes.

Moreover, the process of drawing solvent 51 into the underfill space 300 may advantageously be reversed to increase the effectiveness of cleansing. For example, instead of drawing solvent 51 into the underfill space 300 from the bath as shown in FIG. 7, solvent 51 may be "injected" into the underfill space 300 through the port 203, reversing the direction of solvent flow. Even more advantageously, the direction of solvent flow can be modulated by alternatively drawing solvent through the port 203 into the underfill space 300 from the bath and injecting solvent into the underfill space 300 through the port 203 forcing solvent into the underfill space 300 which then flows out of the underfill space 300 into the bath. This vigorous back and forth solvent flow enhances cleansing action.

With continued reference to FIG. 4, after solvent cleaning is completed a rinse step may optionally be included (Step 413). The rinse step involves removing the remaining flux and residue and removing the solvent from the underfill space 300. The rinsing step typically includes draining the solvent from the bath and refilling the bath with a rinse material. Rinse materials are typically chosen to solvate the solvent used well, and evaporate readily. An example of a satisfactory rinse material is isopropyl alcohol although numerous other possibilities are known to those having ordinary skill in the art. After rinsing the die/substrate assembly is prepared for further processing, for example, the application of an underfill encapsulation layer (Step 415).

The present invention has been particularly shown and described with respect to certain preferred embodiments and features thereof. It is to be understood that the shown embodiments are the presently preferred embodiments of the present invention and as such are representative of the subject matter broadly contemplated by the present invention. The scope of the invention fully encompasses other embodiments which may become obvious to those skilled in the art, and are accordingly to be limited by nothing other than the appended claims, in which reference to an element in the singular is not intended to mean "one and only one" unless explicitly stated, but rather "one or more". All structural and functional equivalents of the elements of the above-described preferred embodiment that are known or later come to be mown to those of ordinary skill in the art are expressly incorporated herein by reference and are intended to be encompassed by the present claims. Moreover, it is not necessary for a device or method to address each and every problem solved by the present invention, for it to be encompassed by the present claims. Furthermore, no element, component, or method step in the present disclosure is intended to be depicted to the public regardless of whether the element, component, or method step is explicitly recited in the claims. No claim element herein is to be construed under the provisions of 35 U.S.C. § 112, paragraph 6, unless the element is expressly recited using the phrase "means for".

What is claimed is:

1. A method of cleaning a cavity in an electronic component comprising the steps of:
   providing an electronic component comprising a die mounted on a packaging substrate such that a cavity is defined between the die and the packaging substrate;
   forming a port in the packaging substrate for flowing a solvent through the cavity;
   providing a solvent bath containing a solvent;
   providing a pump in said solvent bath;
   providing a solvent line having a first end and a second end, said solvent line being disposed in said solvent bath;
   coupling the first end of the solvent line to the port and the second end of the solvent line to the pump;
   immersing the electronic component in the solvent bath; and
   drawing said solvent from the solvent bath into the cavity and through the port and the solvent line with said pump such that the solvent flows through the cavity under pressure and in a flow direction through the solvent line to clean the cavity.

2. The method of claim 1, further comprising reversing the flow direction of the solvent.

3. The method of claim 1 further comprising rinsing the cavity to remove the solvent and other residues from the cavity.

4. The method of claim 3 wherein rinsing the cavity includes draining the solvent from the solvent bath and refilling the solvent bath with a rinsing agent.

5. The method of claim 4 wherein the rinsing agent is isopropyl alcohol.

\* \* \* \* \*